United States Patent
Bayan et al.

(10) Patent No.: US 8,377,267 B2
(45) Date of Patent: Feb. 19, 2013

(54) FOIL PLATING FOR SEMICONDUCTOR PACKAGING

(75) Inventors: Jaime A. Bayan, San Francisco, CA (US); Nghia Thuc Tu, San Jose, CA (US); Will K. Wong, Belmont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 625 days.

(21) Appl. No.: 12/571,223

(22) Filed: Sep. 30, 2009

(65) Prior Publication Data

US 2011/0073481 A1    Mar. 31, 2011

(51) Int. Cl.
C25D 17/00    (2006.01)
B65G 49/02    (2006.01)

(52) U.S. Cl. ......... 204/206; 204/202; 205/137; 205/138

(58) Field of Classification Search ................... 204/202, 204/206

See application file for complete search history.

(56) References Cited

U.S. PATENT DOCUMENTS

| | | | | |
|---|---|---|---|---|
| 3,855,108 | A * | 12/1974 | Bolz et al. | 204/206 |
| 3,900,383 | A * | 8/1975 | Austin et al. | 204/211 |
| 4,264,416 | A * | 4/1981 | Noz | 205/129 |
| 4,464,232 | A * | 8/1984 | Wakano et al. | 205/95 |
| 5,308,797 | A | 5/1994 | Kee | |
| 6,068,755 | A * | 5/2000 | Matsuda et al. | 205/333 |
| 6,268,648 | B1 | 7/2001 | Fukutomi et al. | |
| 6,518,161 | B1 | 2/2003 | Rajagopalan et al. | |
| 6,534,849 | B1 | 3/2003 | Gang | |
| 6,887,364 | B2 * | 5/2005 | Pascal et al. | 205/77 |
| 2004/0127011 | A1 | 7/2004 | Huang et al. | |
| 2006/0201817 | A1 * | 9/2006 | Guggemos et al. | 205/137 |
| 2007/0176303 | A1 | 8/2007 | Murai et al. | |
| 2009/0305076 | A1 | 12/2009 | Wong et al. | |

(Continued)

FOREIGN PATENT DOCUMENTS

| JP | 09-252014 A | 9/1997 |
|---|---|---|
| JP | 2000-252389 | 9/2000 |

(Continued)

OTHER PUBLICATIONS

FlipChip International, "Bump on I/O Process," downloaded on Nov. 1, 2007 from http://www.flipchip.com/services/wafer_level/ultra_csp/bump_process.shtml.

(Continued)

*Primary Examiner* — Harry D Wilkins, III
*Assistant Examiner* — Bryan D. Ripa
(74) *Attorney, Agent, or Firm* — Steven A. Shaw; W. James Brady; Frederick J. Telecky, Jr.

(57) ABSTRACT

Arrangements for plating a single surface of a thin foil are described. In one aspect, a metal foil is wrapped tightly at least partially around a plating solution drum. The drum is partially immersed in a plating solution such that the waterline of the metal plating solution is below a break point where the metallic foil strip begins to unwind from the plating solution drum. With this arrangement, one side of the metallic foil strip is exposed to the metal plating solution, while the opposing back side of the metallic foil strip does not come in substantial contact with the metal plating solution. In this manner, the exposed side of the foil is plated while the back surface of the foil is not plated. The drum may be rotated to convey the foil through the plating solution.

11 Claims, 7 Drawing Sheets

U.S. PATENT DOCUMENTS

| | | |
|---|---|---|
| 2010/0046188 A1 | 2/2010 | Bayan et al. |
| 2010/0084748 A1 | 4/2010 | Poddar et al. |

FOREIGN PATENT DOCUMENTS

| | | |
|---|---|---|
| JP | 2001-127212 | 5/2001 |
| JP | 2004-058578 A | 2/2004 |

OTHER PUBLICATIONS

FlipChip International, "Redistributed Process," downloaded on Nov. 1, 2007 from http://www.flipchip.com/services/wafer_level_ ultra_csp/redistributed_process.shtml.

U.S. Appl. No. 12/571,202, filed Sep. 30, 2009.

Search Report dated Jan. 13, 2010 from International Application No. PCT/US2009/046000.

Written Opinion dated Jan. 13, 2010 in from International Application No. PCT/US2009/046000.

International Search Report dated Dec. 23, 2009 from International Application No. PCT/US2009/043503.

Written Opinion dated Dec. 23, 2009 from International Application No. PCT/US2009/043503.

\* cited by examiner

FOIL PLATING FOR SEMICONDUCTOR PACKAGING

FIELD OF THE INVENTION

The present invention relates generally to the packaging of integrated circuits (ICs). More particularly, the invention relates to methods, apparatuses and systems for plating thin foils.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. Often, the die and portions of the leadframe are encapsulated with a molding material to protect the delicate electrical components on the active side of the die while leaving selected portions of the leadframe exposed to facilitate electrical connections to external devices.

At various times, package designs have been proposed that utilize a metal foil as the electrical interconnect structure in place of the leadframe. Although a number of foil based designs have been developed, none have achieved widespread acceptance in the industry in part because foil based packaging processes tend to be more expensive than conventional leadframe packaging. Accordingly, there are continuing efforts to develop more efficient techniques that improve the cost competitiveness of foil based packaging.

When a metal foil is used to form the interconnects of an integrated circuit package, it is sometimes desirable to pre-plate one side (and only one side) of the foil with a thin metal layer. For example, in packages that utilize gold bonding wires to electrically connect a die to a copper foil, it may be desirable to silver plate the side of the foil that forms the wire bonding surface. This may be desirable because, as is well known in the art, gold does not adhere well to copper but does adhere reasonably well to silver plating. Thus, an intermediate silver layer may be used to help anchor the bonding wires more securely to the foil.

One way to silver plate selected portions of a foil would be to mask portions of the foil that are not to be plated with a dielectric while leaving portions of the foil that are to be plated exposed. The exposed portions of the foil may then be plated using conventional electroplating techniques. Although such a masking approach works well, more cost effective methods for pre-coating a single side of a metal foil are desirable. The present invention provides improved processes for plating foils suitable for use in semiconductor packaging.

SUMMARY OF THE INVENTION

To achieve the foregoing and other objects of the invention improved arrangements for plating just one side of an electrically conductive foil are described. In one aspect, a metal foil is wrapped tightly at least partially around a plating solution drum. The drum is partially immersed in a plating solution such that the waterline of the metal plating solution is below a break point where the metallic foil strip begins to unwind from the plating solution drum. With this arrangement, one side of the metallic foil strip is exposed to the metal plating solution, while the opposing back side of the metallic foil strip does not come in substantial contact with the metal plating solution. In this manner, the exposed side of the foil is plated while the back surface of the foil is not plated. The drum may be rotated to convey the foil through the plating solution.

In some embodiments, the metallic foil strip is drawn from an external source, such as a coil of metallic foil that is positioned away from the plating solution. In other embodiments, the metallic foil may be formed into a coil that is partially submerged within the metal plating solution. In such an arrangement, only one side of the outermost layer of the coil is exposed to the metal plating solution. The opposite side of the metallic foil strip is pressed tightly against a turn in the metallic foil coil such that the metal plating solution does not come in substantial contact with that surface.

Various drums, cleaning stations, drying stations and/or other components can be incorporated into a plating system that includes the aforementioned apparatus. For example, some embodiments of the present invention involve one or more tensioner drums that are positioned along the path of the metallic foil strip to help maintain tension in the metallic foil strip. One or more cleaning stations can be arranged to clean sections of the metallic foil strip before and/or after plating. The metallic foil strip can be unwound from a foil coil before being wound partially around the plating solution drum and passed through the metal plating solution. A receiving drum can be used to recoil sections of the metallic foil strip after plating. The plating solution drum can include a silicone or rubber surface that elastically receives the metallic foil strip and helps prevent the metal plating solution from slipping underneath the strip. Still other embodiments relate to methods for operating the above apparatuses.

Another aspect of the present invention relates to an apparatus that uses a fountain of metal plating solution to plate a metal on one side of a metallic foil strip. In this aspect, a solution emitting device is fluidly coupled with a container of metal plating solution and faces a portion of a side of a metallic foil strip. Two electrodes are arranged to conduct an electrical current through the fountain and the metallic foil strip. The apparatus is arranged to move the metallic foil strip such that different portions of the metallic foil strip pass in front of the solution emitting device. The solution emitting device generates a fountain of metal plating solution that comes in contact with one side of the metallic foil strip. As more of the metallic foil strip passes in front of the solution emitting device and comes in contact with the fountain, more of one side of the metallic foil strip is plated without substantially plating metal on the other side of the metallic foil strip.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present application describes a variety of improved processes for plating just one side of a foil. In the first described embodiment, a metallic foil strip is tightly wrapped around at least a portion of a drum. The drum is positioned within a container that contains a metal plating solution such that a portion of the metallic foil strip is immersed in the metal plating solution. The exposed surface of the metallic foil is then electroplated, while the opposing, unexposed surface of the metallic foil strip is pressed against the drum thereby preventing plating of the unexposed surface. The drum is rotated to convey the metallic foil strip through the metal plating solution. In this manner, a single side of the metallic foil strip can be plated.

Figure 1:
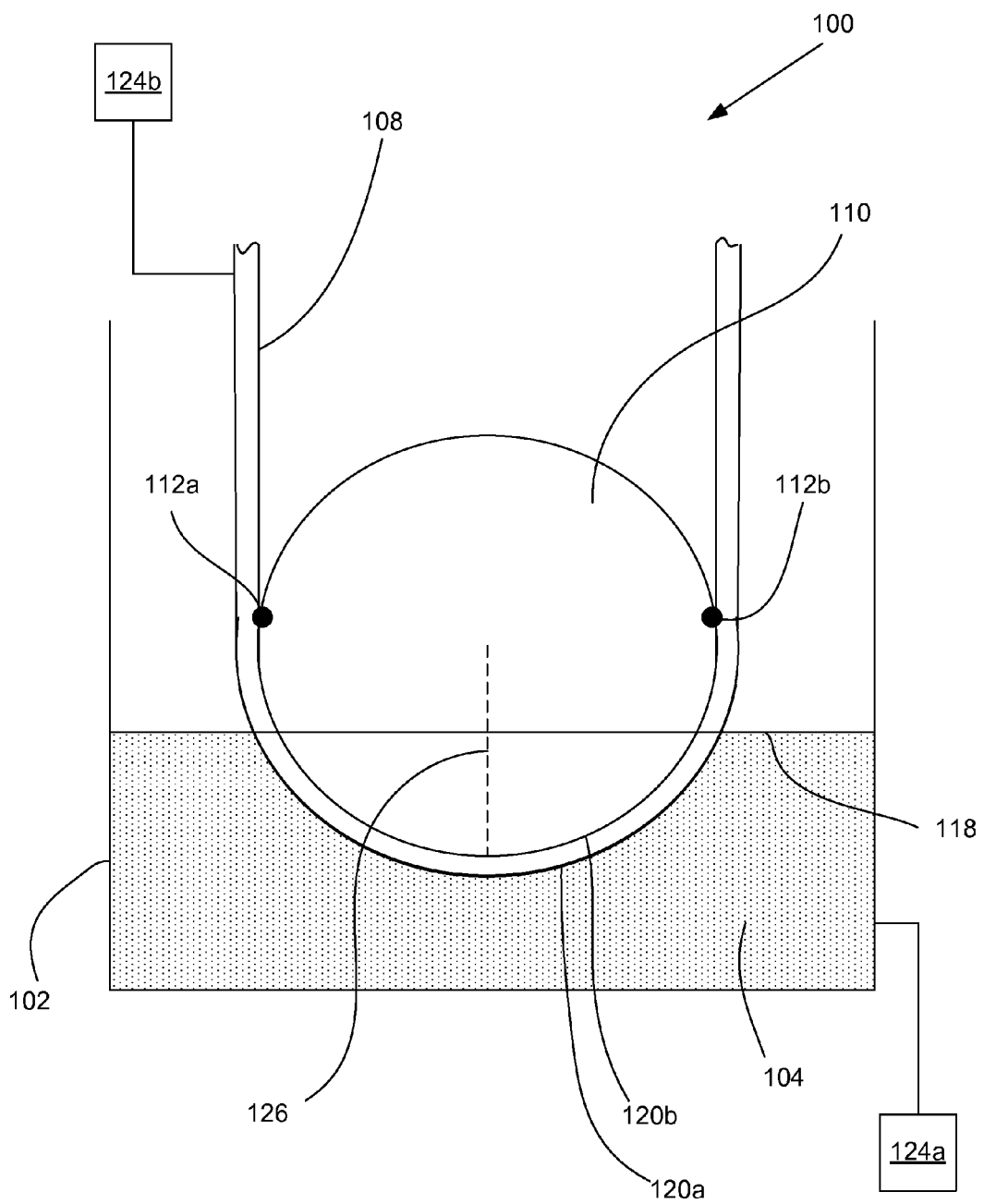
FIG. 1 is a diagrammatic side view of a plating apparatus according to one embodiment of the present invention.

Referring now to FIG. 1, an exemplary plating apparatus 100 for electroplating a metal onto a metallic foil strip will be described. The plating apparatus 100 includes a metal plating solution 104 in a container 102, a metallic foil strip 108, a plating solution drum 110, and first and second electrodes 124a and 124b. Portions of the plating solution drum 110 and the metallic foil 108 are submerged below the waterline 118 of the metal plating solution 104. The metallic foil strip 108 is wound partially around the plating solution drum 110. First and second electrodes 124a and 124b are electrically coupled with the metal plating solution 104 and the metallic foil strip 108, respectively.

The apparatus is designed to plate a metal, such as silver, onto just one surface of the metallic foil strip 108. To this end, first and second electrodes 124a and 124b are arranged to conduct an electrical current through the metallic foil strip 108 and the metal plating solution 104. The second surface 120b is pressed tightly against the plating solution drum 110 so that the exposure of the second surface 120b to the metal plating solution 104 is limited. As a result, metal is plated on the first surface 120a but not substantially on the second surface 120b of the metallic foil strip 108.

In the illustrated embodiment, the metallic foil strip 108 and the plating solution drum 110 are partially immersed in the metal plating solution 104 such that the waterline 118 is below the one or more break points 112 where the metallic foil strip 108 begins to unwind from the plating solution drum 110. The plating solution drum 110 is submerged to a depth that is less than the radius 126 of a cross section of the plating solution drum 110. This arrangement helps ensure that only portions of the metallic foil strip 108 that are pressed against the plating solution drum 110 are immersed within the metal plating solution 104.

The metallic foil strip 108 may be formed from any suitable electrically conductive material and may be of any appropriate thickness, so long as the foil is flexible enough to wrap tightly around the plating solution drum 110. By way of example, copper foil having a thickness in the range of about 8 and 35 microns are desirable for many applications, although it should be appreciated that thicker or thinner foils may be used as well.

In some applications, it may be desirable to prevent metal from being plated on the edges of the metallic foil strip 108. In such embodiments, the edges of the metallic foil strip 108 can be coated with a dielectric material. In one implementation, the dielectric material is applied at the ends of a cylinder formed by coiling the metallic foil strip 108. The metallic foil strip 108 may then be unwound from the coil and passed through apparatus 100. In such an arrangement, the dielectric material that covers the edges of the foil helps prevent plating of the edges.

The surface of the plating solution drum 110 may be formed from any material, so long as it forms a good seal with the foil immersed in the plating solution. In some embodiments, the surface of the drum is formed from a dielectric material having elastic properties. The elastic surface, which can be formed from silicone, rubber and/or other suitable materials, helps form a tighter seal between the metallic foil strip 108 and the plating solution drum 110.

In the illustrated embodiment first and second electrodes 124a and 124b are arranged to provide an electrical potential difference between the foil and the plating solution to provide the electrical current necessary to facilitate electroplating. The electrodes may be placed at any location that is suitable for conducting an electrical current through the metal plating solution 104 and the metallic foil strip 108. By way of example, the first electrode 124a may be directly connected to the container 102 and/or suspended within the metal plating solution 104. The second electrode 124b may take the form of a metallic brush that maintains an electrical connection with the metallic foil strip 108 while the metallic foil strip 108 is in motion. Alternatively or additionally, the second electrode 124b can be directly connected to the plating solution drum 110 or to a foil conveyor roller.

In the illustrated embodiment, the container 102 is open ended and the metallic foil strip 108 extends vertically downward into the container 102, curves around the plating solution drum 110 and then extends vertically upward out of the container 102. In other implementations, the container 102 can be closed or open and the metallic foil strip 108 can extend through the container 102 and connect with the plating solution drum 110 at a variety of other angles/directions, so long as the break points where the foil first touch and first separate from the plating solution are sufficiently clear of the plating solution waterline to prevent the plating solution from contacting the back surface of the foil.

Figure 2:
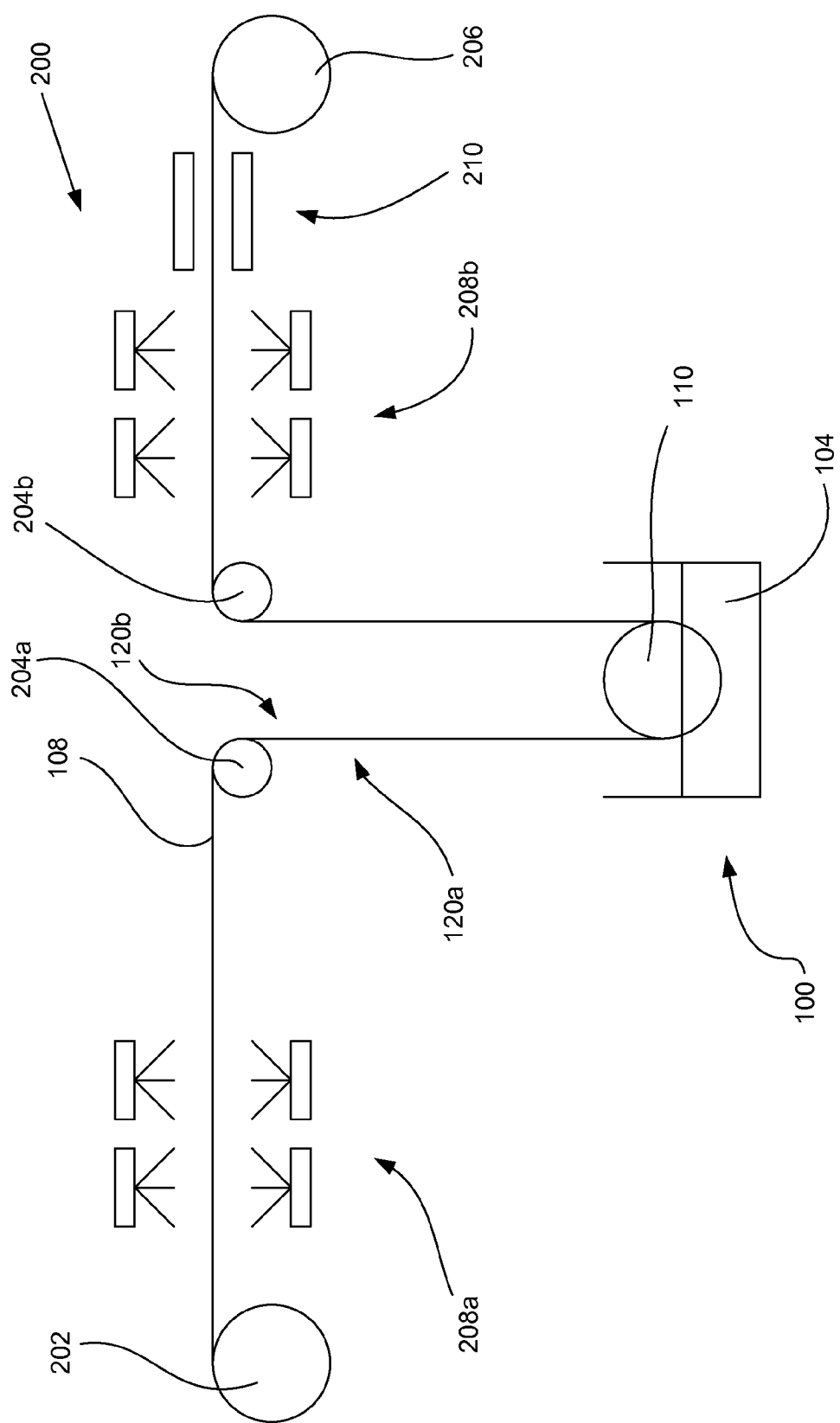
FIG. 2 is a diagrammatic side view of a system that uses the plating apparatus of FIG. 1 and various stations to clean, dry and electroplate a metal onto a metallic foil strip according to one embodiment of the present invention.

Referring next to FIG. 2, another embodiment of the present invention will be described. In this embodiment, the plating apparatus 100 of FIG. 1 is combined with various additional components to form a system for processing and plating metal on one side of a metallic foil strip 108. System 200 includes a foil coil 202, first and second sets of cleaning stations 208a and 208b, first and second tensioner drums 204a and 204b, drying station 210 and a receiving drum 206. The system 200 is arranged to unwind a section of the metallic foil strip from a coil, pass the section through various cleaning, plating and drying modules, and then rewind the section.

In the illustrated embodiment, foil coil 202 serves as the initial source of the metallic foil strip 108. It should be noted that although a coil is a convenient way to store portions of a long metallic foil strip 108, the metallic foil strip 108 can be in various forms (e.g., in different compact configurations, fed in from another processing operation, etc.) prior to being passed through the system 200. A section of the metallic foil strip 108 is then passed through a first set of one or more cleaning stations 208a. The cleaning stations 208a help remove undesirable residues and/or contaminants from the section of the metallic foil strip 108 by spraying water, solvents, detergents, acids and/or other cleaning solutions on the first and/or second surfaces 120a and 120b of the section as appropriate. The cleaning of the section may be performed in various ways e.g., spraying, immersing the metallic foil strip 108 in a cleaning solution, etc.

Afterward, the section of the metallic foil strip 108 is passed around a first tensioner drum 204a. The first tensioner drum 204a is arranged to help reduce slack in the metallic foil strip 108. The increased tension helps press the metallic foil strip 108 more tightly against the plating solution drum 110, which in turn helps prevent the substantial plating of a metal on the second (back) surface 120b of the metallic foil strip, as discussed earlier in connection with FIG. 1.

The section of the metallic foil strip 108 then moves around the plating solution drum 110 and through the metal plating solution 104. A current is conducted through the metallic foil strip 108 and the metal plating solution 104, which results in the electroplating of metal on the first surface 120a of the section of the metallic foil strip 108. As discussed in connection with FIG. 1, substantially no metal is plated onto the second surface 120b of the metallic foil strip 108.

After the section is plated, it travels partially around the second tensioner drum 204b, which, similar to tensioner drum 204a, is arranged to help maintain tension in the metallic foil strip 108. The plated section of the metallic foil strip 108 then passes through a second set 208b of one or more cleaning stations. Similar to the cleaning stations 208a, the cleaning stations 208b apply one or more cleaning fluids to one or both sides of the section. The plated and cleaned section is then passed by a drying station 210, which utilizes heat, air and/or other means to dry the section of the metallic foil strip 108. Finally, the section is rewound or otherwise collected by the receiving drum 206. The aforementioned process may be performed as a continuous process with a moving conveyor of metal foil, or it may be repeated in sections by moving the metallic foil strip 108 in discreet steps. Either way, the foil may be drawn from the coil 202 and ultimately rewound at the receiving drum 206.

The speed with which the metallic foil strip is passed through the metal plating solution 104 and the magnitude of the electrical current that is conducted through the metallic foil strip 108 and the metal plating solution 104 influences the thickness of the metal that is plated onto the first surface 120a of the metallic foil strip 108. In various embodiments, system 200 is coupled with a computing device that enables the setting of the speed, current, metal thickness and/or other parameters.

In the illustrated embodiment, the metallic foil strip 108 is in constant motion. This motion can be maintained in various ways, including rotating the metallic foil strip 108 using one or more drums, pulling a portion of the metallic foil strip 108, etc. In some implementations, a section of the metallic foil strip 108 does not stop moving from the time that it is unwound from the coil 202 to the time that it is rewound at receiving drum 206. In other embodiments, the metallic foil strip 108 stops moving periodically so that the cleaning, plating and/or drying operations can be applied to a particular portion of the metallic foil strip 108 for a sustained period of time.

Figure 3:
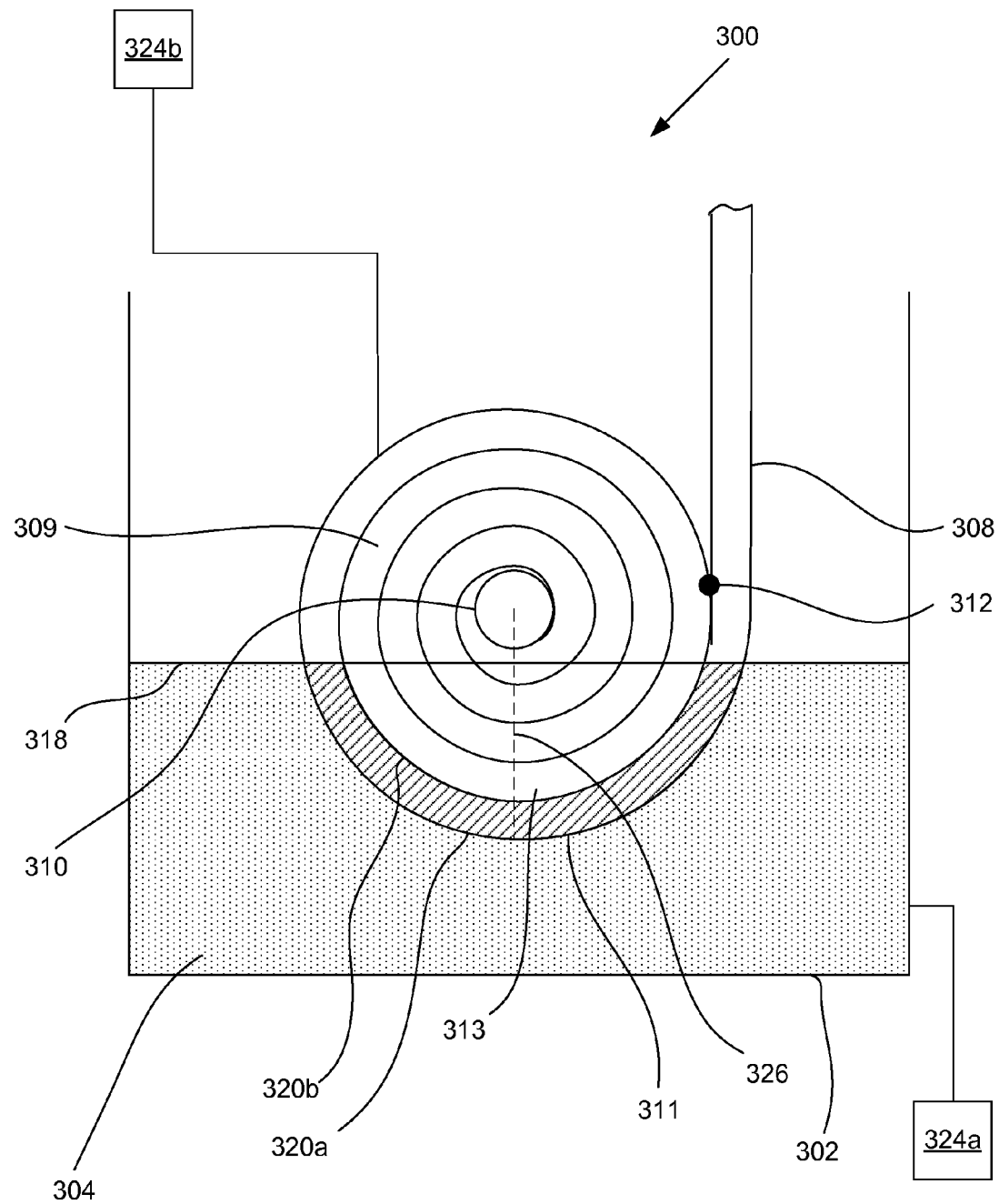
FIG. 3 is a diagrammatic side view of a plating apparatus that involves partially submerging a foil coil in a metal plating solution according to another embodiment of the present invention.

Still another embodiment of the present invention is illustrated in FIG. 3. Plating apparatus 300 includes a metal plating solution 304 in a container 302, a metallic foil strip 308, a plating solution drum 310, and first and second electrodes 324a and 324b. In this embodiment, a coil 309 of metallic foil strip 308 is wrapped around a metal plating drum 310. The coil 309 is partially submerged in the metal plating solution 304. Thus, in this embodiment, the coil 309 is positioned in the metal plating solution 304 and is unwound within the container 302.

Plating apparatus 300 is arranged to perform a plating process that plates metal primarily on the first surface 320a and not on the second surface 320b of the metallic foil strip 308. To this end, the metallic foil strip 308 is tightly coiled around the plating solution drum 310. As a result, while the first surface 320a of an outermost section 311 of the metallic foil strip 308 is exposed to the metal plating solution 304, the back surface 320b of the section 311 is pressed tightly against a turn 313 of the coil 309, thus helping to prevent the metal plating solution 304 from coming in substantial contact with the back surface 320b. When first and second electrodes 324a and 324b are used to conduct an electrical current through the metal plating solution 304 and the metallic foil strip 308, metal is plated on the first surface 320a of the metallic foil strip 308 and not substantially plated on the second surface 320b.

To help limit the plating of metal to just the first surface 320a, the waterline 318 of the metal plating solution 304 is positioned below a break point 312 where the metallic foil strip 308 begins to unwind from the coil 309 and where the second surface 320b of the metallic foil strip 308 starts to peel away from the coil 309 and become exposed. The coil 309 is submerged to a depth that is less than the radius 326 of the coil.

Almost any of the features described in connection with FIGS. 1-2 can be used to modify corresponding features of the plating apparatus 300. For example, the unwinding of the coil 309 and the moving of the metallic foil strip 308 can be performed by rotating the plating solution drum 310, pulling a leading edge and/or a portion of the metallic foil strip 308, etc. As described above, a dielectric coating can be applied to the edges of the metallic foil strip 308 and/or coil 309 to help limit the plating of metal to the first surface 320a. The speed of the unwinding of the coil and/or the magnitude of the current between the first and second electrodes 324a and 324b can be adjusted to help control the thickness of the metal that is electroplated on the first surface 320a of the metallic foil strip 308. The first and second electrodes 324a and 324b can be arranged in almost any manner suitable for maintaining an electrical current through the metallic foil strip 308 and the metal plating solution 304.

Figure 4:
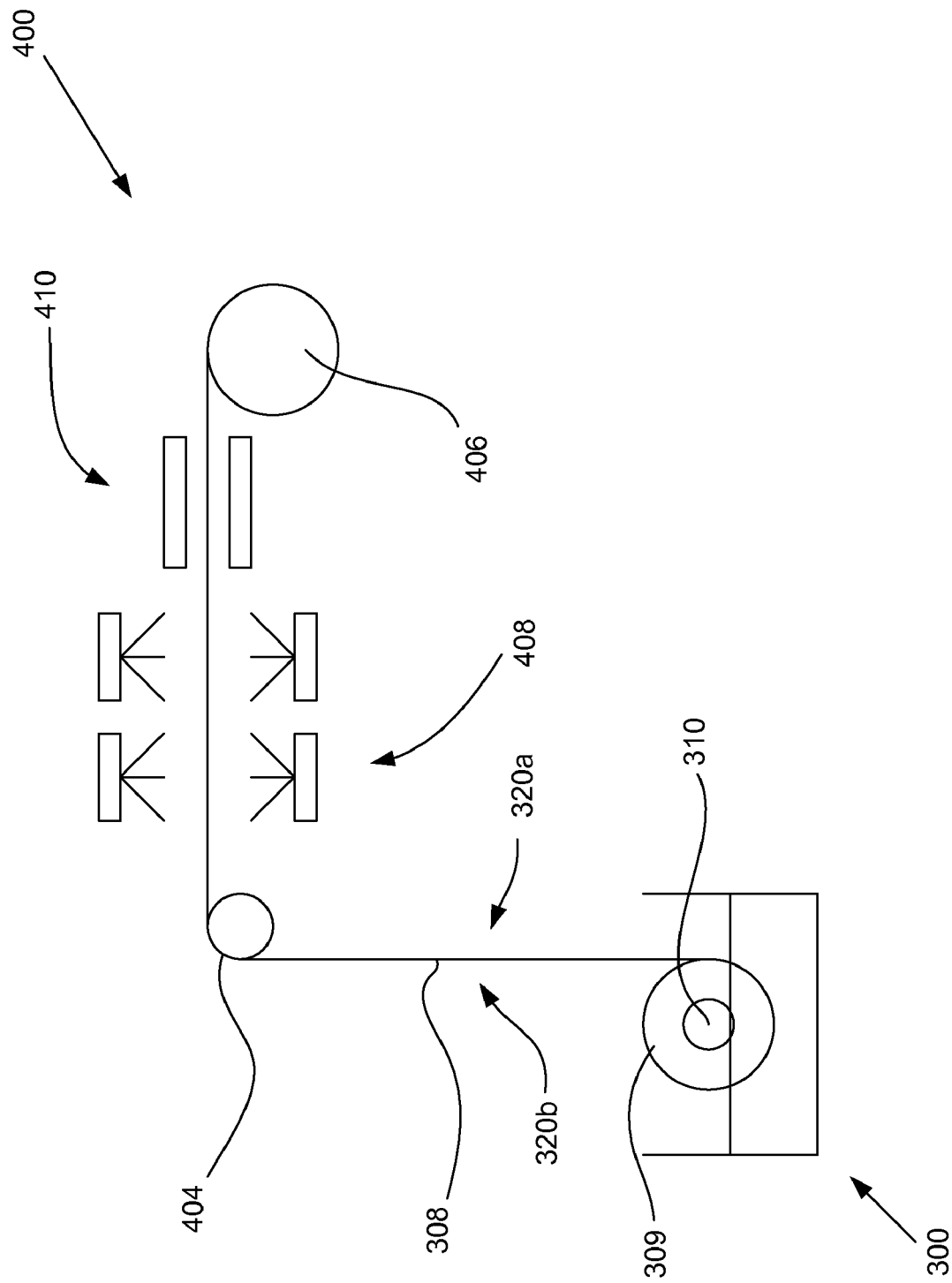
FIG. 4 is a diagrammatic side view of a system that uses the plating apparatus of FIG. 3 and various stations to clean, dry and electroplate a metal onto a metallic foil strip according to one embodiment of the present invention.

FIG. 4 illustrates an additional embodiment where the plating apparatus 300 of FIG. 3 is integrated into a system 400 that cleans, dries, and recoils the metallic foil strip 308. System 400 includes the plating apparatus 300, the metallic foil strip 308, a tensioner drum 404, a set of cleaning stations 408, a drying station 410 and a receiving drum 406. Metallic foil strip 308 extends from the foil coil 309, extends partially around the tensioner drum 404, past the cleaning stations 408 and the drying station 410 and then is ultimately recoiled by the receiving drum 406.

The tensioner drum 404 helps increase tension in the metallic foil strip 308, which in turn helps press an outer section 311 of the foil coil 309 more firmly against an inner turn of the foil coil 309, as discussed earlier in connection with FIG. 3. This helps substantially limit the plating of metal to the first surface 320a of the metallic foil strip 308.

Plated sections of the metallic foil strip 308 then move past the cleaning stations 408. Cleaning stations 408 are arranged to spray cleaning solution, water and/or other suitable cleaning solvents onto the metallic foil strip 308. The cleaned, plated section of the metallic foil strip 308 is then dried by drying station 410 and recoiled or otherwise arranged in a compact form by receiving drum 406. It should be appreciated that the drums, stations and other components of the system 400 can be modified using any of the features described in connection with FIG. 2.

Figure 5:
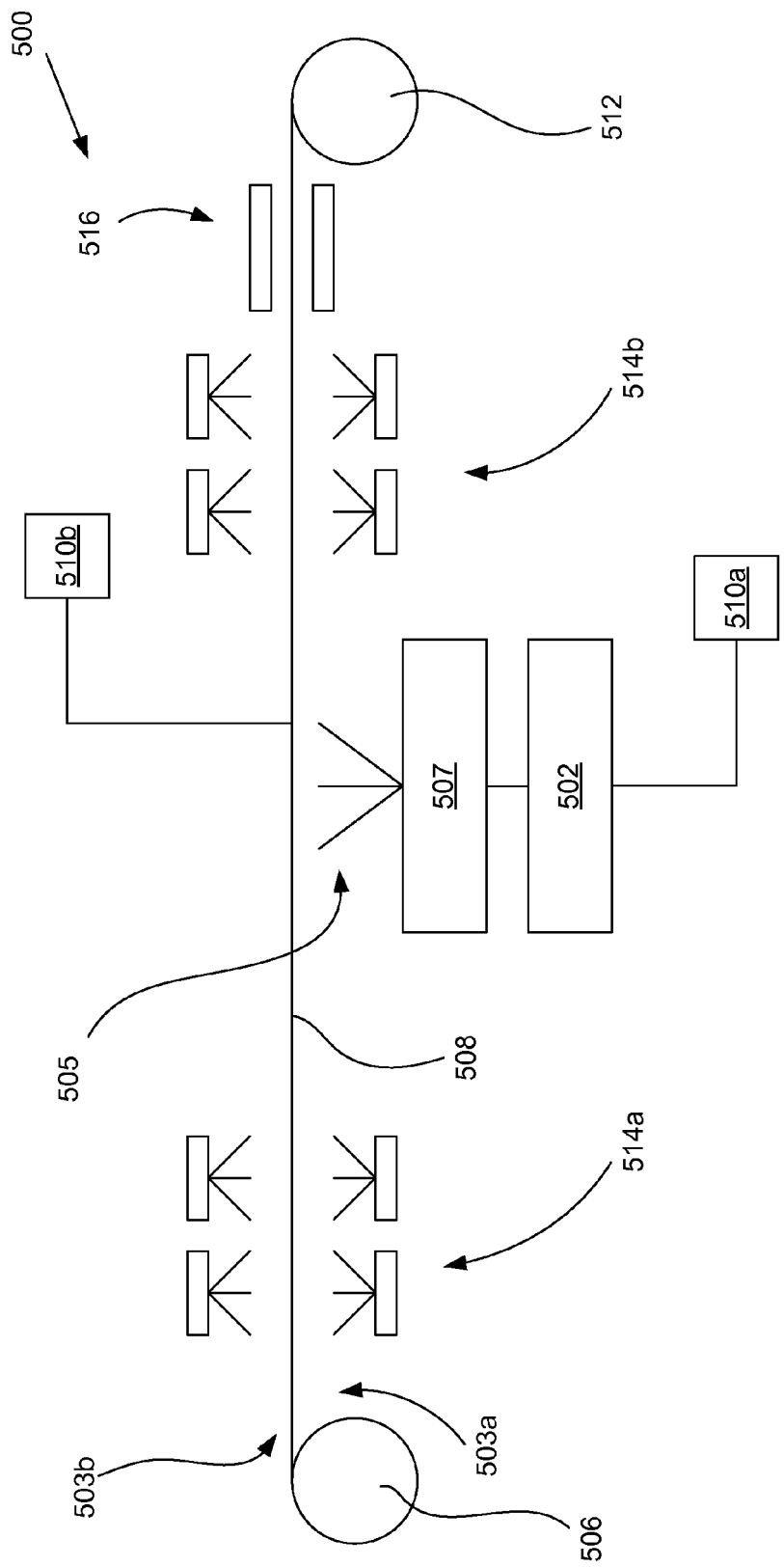
FIG. 5 is a diagrammatic side view of a system that uses a fountain of metal plating solution to plate metal on a surface of a metallic foil strip in accordance with one embodiment of the present invention.

Referring to FIG. 5, another aspect of the present invention is described. System 500 uses a fountain 505 of metal plating solution to plate a single surface of metallic foil strip 508. The system 500 includes a metallic foil strip 508 drawn from a foil coil 506, first and second sets of cleaning stations 514a and 514b, first and second electrodes 510a and 510b, a metal plating solution (not shown) in a container 502, a fountain 505 of metal plating solution that is emitted by a solution emitting device 507, a drying station 516 and a receiving drum 512. The metallic foil strip 508, which is drawn from the coil 506, passes through the system 500 and is ultimately recoiled at receiving drum 512. The solution emitting device 507 is fluidly coupled with the container 502 and can generate a fountain 505 from the metal plating solution in the container 502. The fountain 505 is continually generated by the solution emitting device 507 such that the fountain 505 is in contact with the metallic foil strip 508 for a sustained period of time. The first and second electrodes are arranged to conduct an electrical current through the fountain 505 and the metallic foil strip 508. As a result, as sections of the metallic foil strip 508 pass through the fountain, metal is plated on these sections.

The solution emitting device 507 is arranged to direct the fountain 505 towards a first surface 503a of the metallic foil strip 508. In the illustrated embodiment, the fountain 505 directly strikes one or more impact regions on the first surface 503a. Surface tension helps the metal plating solution spread out beyond the impact regions and across the first surface 503a. As a result, portions of the first surface 503a are coated with the metal plating solution and plated with a metal even when they have not been directly struck by the fountain 505. The metal plating solution, however, tends not to come in substantial contact with the opposing second surface 503b of the metallic foil strip 508.

It should be appreciated that the illustrated embodiment can be modified to address the needs of various applications. For example, although only one fountain 505 is depicted, there could also be more than one fountain. The fountain 505 can take various forms, including one or more streams, geysers, jets, sprays, etc. In the illustrated embodiment, the fountain 505 is projected in a direction approximately perpendicular to the first surface 503a of the metallic foil strip 508. In other implementations, one or more fountains can each approach the metallic foil strip 508 from almost any angle or direction. The first electrode 510a can be electrically coupled with and/or directly connected to the fountain 505, the metal plating solution and/or the container 502. The second electrode 510b can maintain an electrical connection with the metallic foil strip 508 using any of the features described in connection with second electrode 124b of FIG. 1.

The first and second sets of cleaning stations 514a and 514b clean sections of the metallic foil strip 508 before and after they are plated by the fountain 505, respectively. The cleaned and plated sections of the metallic foil strip 508 are then dried by drying station 516 before being wound around receiving drum 512. The cleaning stations 514a and 514b, the drying station 516 and other parts of system 500 can have features similar to the corresponding components described in connection with FIGS. 2 and 4.

Figure 6A:
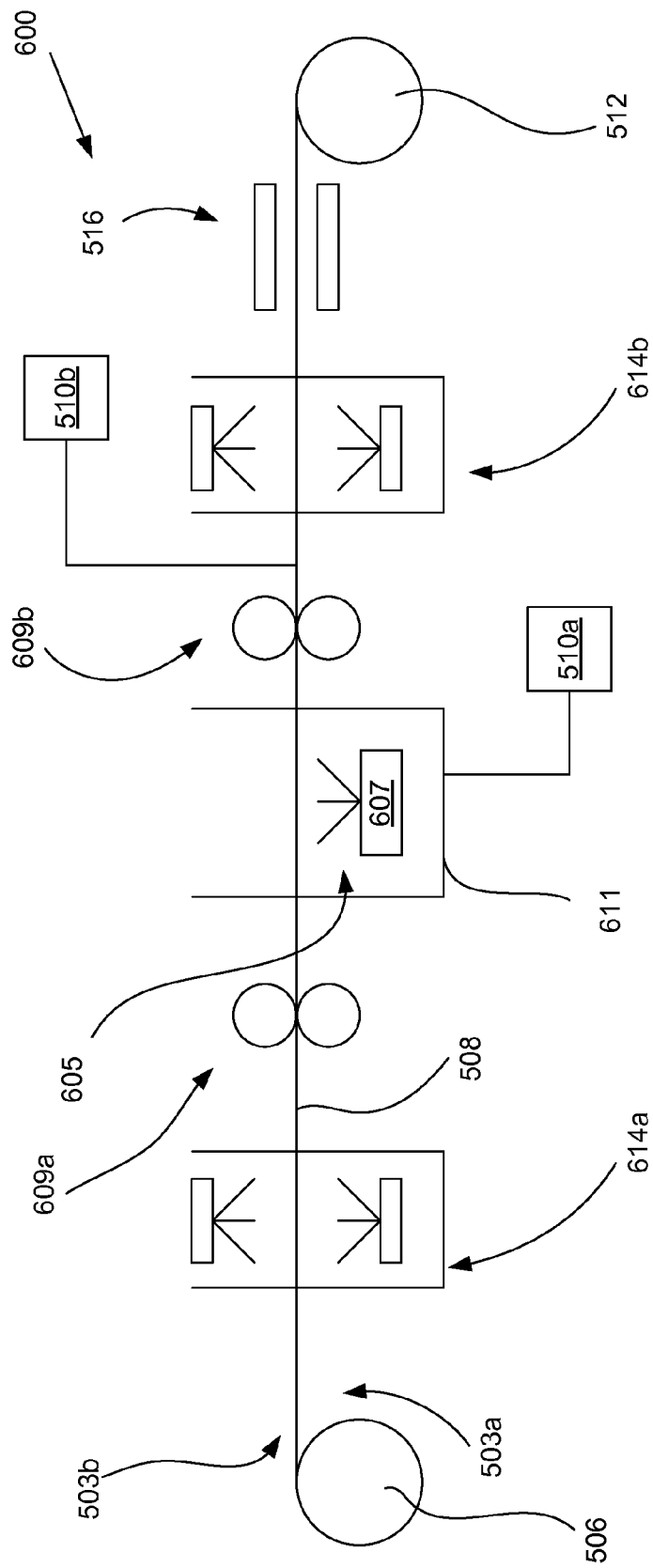
FIG. 6A is a diagrammatic side view of another embodiment of the present invention that uses a fountain to plate metal on a surface of a metallic foil strip.

Referring to FIG. 6A, another embodiment of a foil plating system 600 is described. System 600 includes a foil coil 506, a metallic foil strip 508 having first and second surfaces 503a and 503b, a first set of one or more cleaning stations 614a, a second set of one or more cleaning stations 614b, first and second sets of guard rollers 609a and 609b, plating fountain 605, a solution emitting device 607, a plating container 611 having a metal plating solution (not shown), first and second electrodes 510a and 510b, a drying station 516 and a receiving drum 512. Various components of the foil plating system 600, including foil coil 506, metallic foil strip 508, first and second electrodes 510a and 510b and receiving drum 512, resemble those described in connection with FIG. 5 and can perform in an analogous manner to plate a single side of the metallic foil strip 508. Foil plating system 600 has additional features to help improve the efficiency and effectiveness of the plating process.

For example, a first set of one or more guard rollers 609a are arranged to prevent chemical contamination between the cleaning and/or metal plating solutions. First set of guard rollers 609a is positioned along the path of the metallic foil strip 508 between the first cleaning station 614a and the plating fountain 605. After a section of the metallic foil strip 508 is cleaned by the cleaning station 614a using a cleaning solution, the cleaned section is passed through the first set of guard rollers 609a. In the illustrated embodiment, the guard rollers 609a are pressed flush against opposing first and second surfaces 503a and 503b of the metallic foil strip 508. As the guard rollers 609a rotate to help pass through sections of the metallic foil strip, cleaning solution residue is wiped, squeezed, absorbed and/or otherwise removed from the first and second surfaces 503a and 503b of the metallic foil strip 508. As a result, when the cleaned section comes in contact with the fountain 605 of metal plating solution, the risk and degree of chemical contamination of the metal plating solution by the cleaning solution is reduced. After sections of the metallic foil strip 508 have been plated through contact with the fountain 605, they are then moved through the second set of guard rollers 609b. The second set of guard rollers 609b, which are positioned along the path of the metallic foil strip 508 between the plating fountain 605 and the second set of cleaning stations 614b, is similarly arranged to remove metal plating solution from sections of the metallic foil strip 508. This feature helps limit cross-contamination between the metal plating solution and the cleaning solution later applied by the second set of cleaning stations 614b. It should be appreciated that the number and/or locations of the guard rollers may vary widely, depending on the needs of a particular application. Generally, guard rollers can be positioned in almost any location of the plating system 600 where they can help prevent undesirable chemical reactions between different solutions that are applied at different times to the metallic foil strip 508.

Plating system 600 further includes a solution emitting device 607 and a plating container 611 that are arranged to collect and reuse metal plating solution. In a process similar to the one described in connection with FIG. 5, the solution emitting device 607 emits a fountain 605 of metal plating solution that contacts a single side of the metallic foil strip 508 (i.e., first surface 503a). After coming in contact with the metallic foil strip 508, the metal plating solution spills off of the metallic foil strip 508 and is collected within the plating container 611. The solution emitting device is fluidly coupled with the plating container 611 so that it can reuse the collected metal plating solution to continue to form the fountain 605.

Figure 6B:
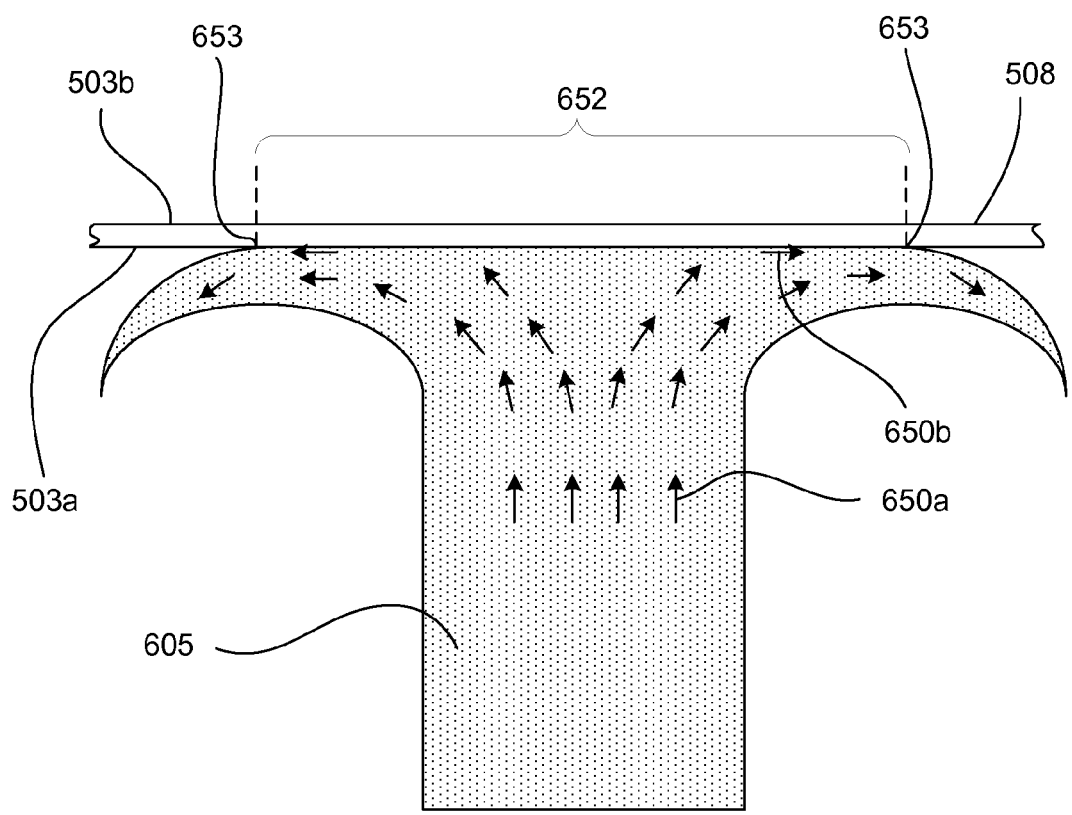
FIG. 6B is an enlarged side view of the fountain and a portion of the metallic foil strip illustrated in FIG. 6A accordance with one embodiment of the present invention.

Referring now to FIG. 6B, an exemplary way of forming and generating the fountain 605 is described. The described implementation helps limit the metal plating solution to a single side of the metallic foil strip 508 by having some of the metal plating solution in the fountain 605 flow laterally over the surface of the metallic foil strip 508. FIG. 6B is an enlarged view of the fountain 605 and a portion of the metallic foil strip 508 of FIG. 5. In the illustrated embodiment, arrows 650 indicate the direction of the flow of the metal plating solution that makes up the fountain 605. As indicated by the arrow 650a, the metal plating solution is propelled towards the first surface 503a of the metallic foil strip 508. The metal plating solution is propelled with a moderate amount of force, such that gravity causes the stream of metal plating solution to bend and spread out prior to reaching the metallic foil strip 508. As indicated by the arrow 650b, in portions of the fountain 605 adjacent to the first surface 503a of the metallic foil strip 508, the metal plating solution is flowing in a direction substantially parallel to the first surface 503a. At the edges 653 of the region 652 where the fountain 605 is in contact with the metallic foil strip 508, the angle of incidence between the incoming flow of metal plating solution and the first surface 503a is oblique (e.g., approximately between 80° and 90°). This reduces the likelihood that metal plating solution will curl around and come in contact with the second surface 503b of the metallic foil strip 508.

Although only a few embodiments of the invention have been described in detail, it should be appreciated that the invention may be implemented in many other forms without departing from the spirit or scope of the invention. For example, FIGS. 2 and 4 describe plating systems that have multiple components, such as tensioner and receiving drums, coils, cleaning stations, drying stations etc. Each of these components can be removed, replaced, rearranged, multiplied and/or otherwise modified to suit the needs of particular applications. For example, although the path of the metallic foil strip in FIGS. 2 and 4 begins with a coil and ends with a receiving drum, this need not be the case. In various implementations, the metallic foil strip may be fed into the system not in a coiled form, but in some other compact form, or fed uncoiled into the system from another processing operation. In another implementation, the metallic metal strip, after being plated and dried, may not be recoiled, as depicted in the illustrated embodiments, but may be instead arranged in a different compact form and/or a form that is appropriate for further processing.

It should also be appreciated that any feature of a component in one embodiment can be applied to a corresponding component in another embodiment. For example, although use of an elastic material for the surface of the plating solution drum 110 was primarily described in connection with FIG. 1, it should be appreciated that such a feature may be used in connection with any of the described plating solution drums. The elastic surface may be formed from any elastic material that is suitable for use in an electroplating solution, such as silicone or rubber. Therefore, the present embodiments should be considered as illustrative and not restrictive and the invention is not limited to the details given herein, but may be modified within the scope and equivalents of the appended claims.

What is claimed is:

1. An apparatus for plating metal on a surface of a metallic foil for use in semiconductor packaging, comprising:
    a container containing a metal plating solution;
    a plating solution drum positioned over the container;
    a metallic foil strip having a first surface and an opposing second surface, portions of the metallic foil strip wound tightly and completely around the plating solution drum to form a metallic foil coil such that the first surface of the metallic foil strip is at least partially exposed to and immersed in the metal plating solution and the second surface of the metallic foil strip is pressed tightly against a turn in the metallic foil coil and does not come in substantial contact with the metal plating solution;
    a first electrode electrically coupled with the metal plating solution; and
    a second electrode electrically coupled with the metallic foil strip, the first and second electrodes arranged to conduct an electrical current through the metal plating solution and the metallic foil strip,
    wherein the apparatus is arranged to rotate the metallic foil strip at least partially around the plating solution drum and through the metal plating solution, the apparatus further arranged to plate metal from the metal plating solution on additional portions of the first surface of the metallic foil strip during said rotating without substantially plating metal on the second surface of the metallic foil strip.

2. The apparatus of claim 1 wherein a waterline of the metal plating solution is positioned below one or more break points on the metallic foil strip where the metallic foil strip starts to unwind from the plating solution drum and the second surface of the metallic foil strip starts to become exposed.

3. The apparatus of claim 1, wherein the plating solution drum is partially submerged in the metal plating solution to a depth that is less than the radius of a cross section of the plating solution drum, thereby helping to prevent the metal plating solution from slipping underneath a portion of the metallic foil strip that is unwinding from the plating solution drum.

4. The apparatus of claim 1, wherein the plating solution drum includes an elastic silicone surface, the silicone surface pressing against a portion of the metallic foil strip to help prevent metal plating solution from coming in substantial contact with the second surface of the metallic foil strip.

5. The apparatus of claim 1 further comprising a tensioner drum, the metallic foil strip winding at least partially around the tensioner drum, the tensioner drum helping to increase tension in the metallic foil strip, thereby helping prevent metal plating solution from reaching the second surface of the metallic foil strip.

6. The apparatus of claim 1 further comprising a receiving drum positioned to receive portions of the metallic foil strip that have been in contact with the metal plating solution, the receiving drum arranged to wind portions of the metallic foil strip around the receiving drum.

7. The apparatus of claim 1 further comprising:
    a first set of one or more cleaning stations, the first set of cleaning stations positioned along a path of the metallic foil strip between the plating solution drum and a receiving drum, the first set of cleaning stations arranged to clean a section of the metallic foil strip after the section has been plated; and
    a drying station positioned along the path of the metallic foil strip between one of the cleaning stations and the receiving drum, the drying station arranged to dry portions of the metallic foil strip prior to the winding of the dried portions around the receiving drum.

8. The apparatus of claim 1 wherein the second electrode is a metallic brush arranged to maintain an electrical connection with the metallic foil strip when the metallic foil strip is in motion.

9. The apparatus of claim 1 wherein the metallic foil strip is made of copper and the metal plating solution is a silver plating solution.

10. The apparatus of claim 1 wherein an electrically non-conductive material is applied on edges of the metallic foil strip to help prevent metal from plating onto the edges.

11. The apparatus of claim 1, the apparatus further comprising:
- a receiving drum, a portion of the metallic foil strip being wound at least partially around the receiving drum, the receiving drum arranged to recoil portions of the metallic foil strip that were unwound from the metallic foil coil;
- a tensioner drum, the metallic foil strip winding at least partially around the tensioner drum, the tensioner drum positioned along a path of the metallic foil strip between the plating solution drum and the receiving drum and arranged to help increase tension in the metallic foil strip and help press the metallic foil strip more firmly against the metallic foil coil;
- a set of one or more cleaning stations positioned along a path of the metallic foil strip between the second and the receiving drum, the second arranged to clean the section after the section has been plated; and
- a drying station positioned along the path of the metallic foil strip between the set of cleaning stations and the receiving drum, the drying station arranged to dry the section of the metallic foil strip after the section has been plated and cleaned.

* * * * *